(12) United States Patent
Li et al.

(10) Patent No.: US 8,203,893 B2
(45) Date of Patent: Jun. 19, 2012

(54) WRITE CURRENT COMPENSATION USING WORD LINE BOOSTING CIRCUITRY

(75) Inventors: Hai Li, Eden Prairie, MN (US); Yiran Chen, Eden Prairie, MN (US); Harry Hongyue Liu, Maple Grove, MN (US); Henry Huang, Apple Valley, MN (US); Ran Wang, Irving, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/210,934

(22) Filed: Aug. 16, 2011

(65) Prior Publication Data

US 2011/0299324 A1    Dec. 8, 2011

Related U.S. Application Data

(63) Continuation of application No. 12/967,802, filed on Dec. 14, 2010, now Pat. No. 8,009,457, which is a continuation of application No. 12/426,098, filed on Apr. 17, 2009, now Pat. No. 7,855,923.

(60) Provisional application No. 61/109,965, filed on Oct. 31, 2008.

(51) Int. Cl.
    *G11C 5/14*      (2006.01)
    *G11C 11/00*     (2006.01)
    *G11C 17/00*     (2006.01)
    *G11C 11/14*     (2006.01)

(52) U.S. Cl. ............ 365/189.09; 365/148; 365/163; 365/171; 365/230.06

(58) Field of Classification Search ......... 365/189.09
See application file for complete search history.

(56) References Cited

U.S. PATENT DOCUMENTS

| | | | |
|---|---|---|---|
| 5,673,225 A | 9/1997 | Jeong et al. | |
| 7,020,024 B2 | 3/2006 | Sim | |
| 7,224,601 B2 | 5/2007 | Panchula | |
| 7,403,418 B2 | 7/2008 | Lin et al. | |
| 7,411,815 B2 | 8/2008 | Gogl | |
| 7,515,457 B2 | 4/2009 | Chen et al. | |
| 7,764,537 B2 | 7/2010 | Jung et al. | |
| 7,782,661 B2 | 8/2010 | Yang | |
| 7,855,923 B2 * | 12/2010 | Li et al. ............... | 365/189.09 |
| 7,881,095 B2 | 2/2011 | Lu et al. | |
| 2007/0025164 A1 | 2/2007 | Kim et al. | |
| 2007/0097730 A1 | 5/2007 | Chen et al. | |
| 2007/0279968 A1 | 12/2007 | Luo et al. | |
| 2007/0297223 A1 | 12/2007 | Chen et al. | |
| 2008/0205121 A1 | 8/2008 | Chen et al. | |
| 2009/0073756 A1 | 3/2009 | Yang | |
| 2010/0034009 A1 | 2/2010 | Lu et al. | |
| 2010/0177558 A1 | 7/2010 | Sakimura et al. | |

* cited by examiner

*Primary Examiner* — Son Mai
(74) *Attorney, Agent, or Firm* — Hall Estill Attorneys at Law

(57) ABSTRACT

Apparatus and method for write current compensation in a non-volatile memory cell, such as but not limited to spin-torque transfer random access memory (STRAM) or resistive random access memory (RRAM). In accordance with some embodiments, a non-volatile memory cell has a resistive sense element (RSE) coupled to a switching device, the RSE having a hard programming direction and an easy programming direction opposite the hard programming direction. A voltage boosting circuit includes a capacitor which adds charge to a nominal non-zero voltage supplied by a voltage source to a node to generate a temporarily boosted voltage. The boosted voltage is applied to the switching device when the RSE is programmed in the hard programming direction.

20 Claims, 6 Drawing Sheets

STRAM MEMORY CELL

US 8,203,893 B2

WRITE CURRENT COMPENSATION USING WORD LINE BOOSTING CIRCUITRY

RELATED APPLICATIONS

This application is a continuation of copending U.S. patent application Ser. No. 12/967,802 filed Dec. 14, 2010 which is a continuation of U.S. patent application Ser. No. 12/426,098 filed Apr. 17, 2009 which makes a claim of domestic priority under 35 U.S.C. § 119(e) to U.S. Provisional Patent Application No. 61/109,965 filed Oct. 31, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

Some non-volatile memory cells can employ resistive sense elements (RSEs) which can be configured to have different electrical resistances to store different logical states. The resistance of the cells can be subsequently detected during a read operation by applying a read current through the cell and sensing a voltage drop across the cell. Exemplary types of RSE constructions include but are not limited to spin-torque transfer random access memory (STRAM) and resistive random access memory (RRAM). In these and other types of electronic devices, it is often desirable to increase data transfer performance while decreasing power consumption.

SUMMARY

Various embodiments of the present invention are generally directed to an apparatus and associated method for compensating for write characteristics of a memory cell, such as in a spin-torque transfer random access memory (STRAM) or a resistive random access memory (RRAM).

In accordance with some embodiments, the apparatus generally comprises a non-volatile memory cell comprising an resistive sense element (RSE) coupled to a switching device, the RSE having a hard programming direction and an easy programming direction opposite the hard programming direction. A voltage boosting circuit comprises a capacitor which adds charge to a nominal non-zero voltage supplied by a voltage source to a node to generate a temporarily boosted voltage. The boosted voltage is applied to the switching device when the RSE is programmed in the hard programming direction.

In accordance with other embodiments, the method generally comprises providing a non-volatile memory cell comprising a resistive sense element (RSE) coupled to a switching device, with the RSE having a hard programming direction and an easy programming direction opposite the hard programming direction. A voltage boosting circuit is used comprising a capacitor which adds charge to a nominal non-zero voltage supplied by a voltage source to a node to generate a temporarily boosted voltage when programming the RSE in the hard programming direction.

These and other features and advantages which characterize the various embodiments of the present invention can be understood in view of the following detailed discussion and the accompanying drawings.

DETAILED DESCRIPTION

Figure 1:
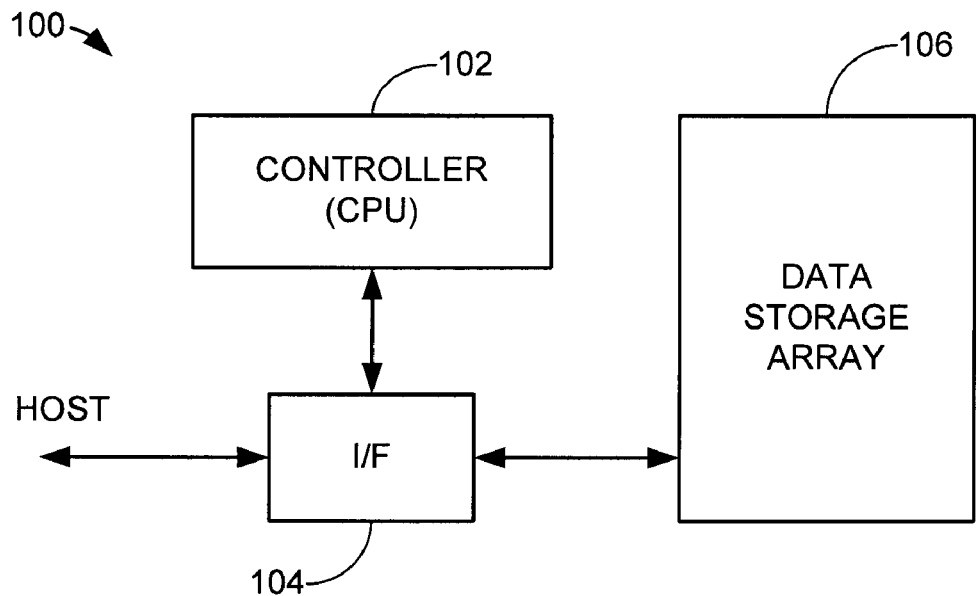
FIG. 1 generally illustrates a functional block representation of a data storage device.

FIG. 1 provides a functional block representation of a data storage device 100 constructed and operated in accordance with various embodiments of the present invention. The device 100 includes a top level controller 102, an interface (I/F) circuit 104 and a data storage array 106. The I/F circuit 104 operates under the direction of the controller 102 to transfer user data between the array 106 and a host device (not shown). In some embodiments, the device is characterized as a solid-state drive (SSD), the controller 102 is a programmable microcontroller, and the array 106 comprises an array of nonvolatile memory cells.

Figure 2:
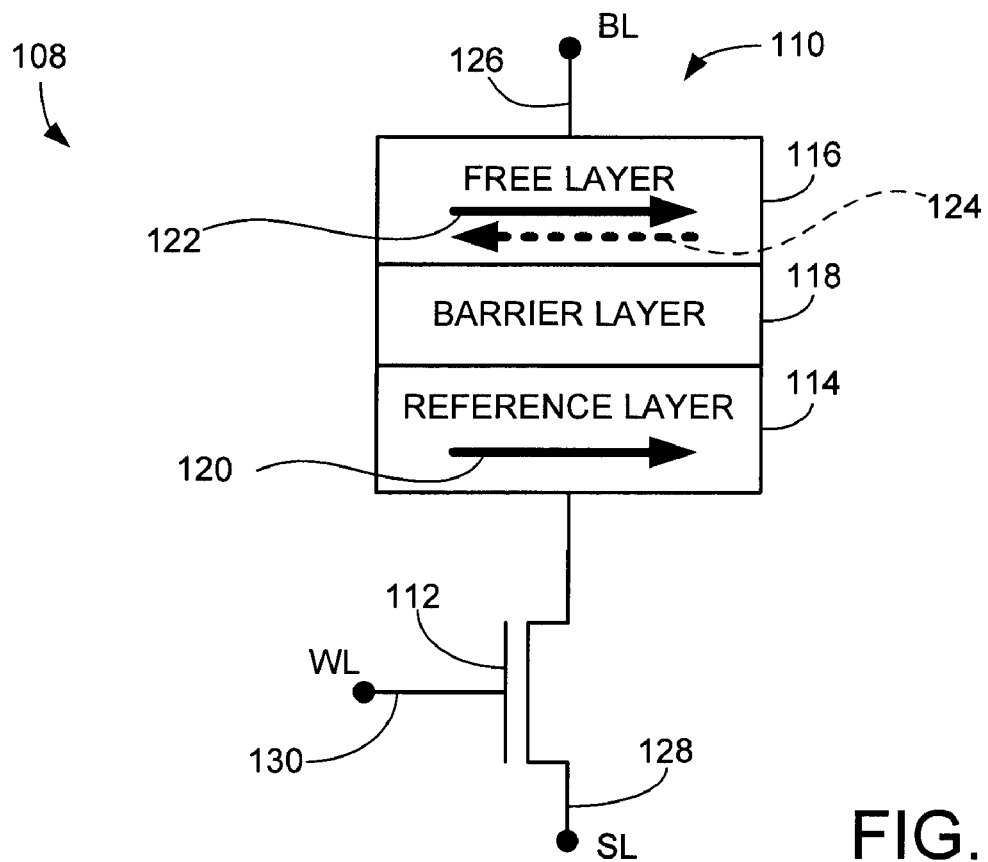
FIG. 2 generally illustrates an exemplary STRAM memory cell for the device of FIG. 1.

An exemplary memory cell construction for the array 106 is shown in FIG. 2 at 108. The memory cell 108 includes a resistive sense element (RSE) 110 coupled to a switching device 112. The cell 108 has a spin-torque transfer random access memory (STRAM) configuration so that the RSE 110 is characterized as a magnetic tunneling junction (MTJ), although other cell configurations can be used. The switching device 112 is contemplated as comprising an n-channel metal oxide semiconductor field effect transistor (NMOSFET).

The MTJ 110 includes a fixed reference layer 114 and a programmable free layer 116 (recording layer) separated by an intervening tunneling (barrier) layer 118. The reference layer 114 has a fixed magnetic orientation in a selected direction, as indicated by arrow 120. This fixed magnetic orientation can be established in a number of ways, such as via pinning to a separate magnet (not shown).

The free layer 116 has a selectively programmable magnetic orientation that can be parallel (solid arrow 122) or anti-parallel (dotted arrow 124) with the selected direction of the reference layer 114. Other respective magnetization orientations can be used, such as orientations substantially perpendicular to those shown in FIG. 2.

A low resistance state for the MTJ 110 is achieved when the magnetization of the free layer 116 is oriented to be substantially in the same direction (parallel) as the magnetization of the reference layer 114. To orient the MTJ 110 in the parallel low resistance state, a write current passes through the MTJ 110 so that the magnetization direction of the reference layer 114 sets the magnetic orientation of the free layer 116. Since electrons flow in the direction opposite to the direction of current, the write current direction passes from the free layer 116 to the reference layer 114, and the electrons travel from the reference layer 114 to the free layer 116.

A high resistance state for the MTJ 110 is established in the anti-parallel orientation in which the magnetization direction of the free layer 116 is substantially opposite that of the reference layer 114. To orient the MTJ 110 in the anti-parallel resistance state, a write current passes through the MTJ 110 from the reference layer 114 to the free layer 116 so that spin-polarized electrons flow into the free layer 116 in the opposite direction.

A different logical state is assigned to each of the programmable resistances of the MTJ. In some embodiments, the low resistance, parallel state is used to represent a logical 0, and the high resistance, anti-parallel state is used to represent a logical 1. Additional programmed states can be used when the MTJ is configured to store multiple bits. For example, programmed resistances R1<R2<R3<R4 can be used to respectively store multi-bit values "00," "01," "10" and "11."

The memory cell 108 is accessed by a number of control lines including a bit line BL 126, a source line SL 128 and a word line WL 130. Assertion of a suitable gate control voltage to the WL 130 places the transistor 112 in a drain-to-source conductive state, facilitating the selective flow of read and write currents between the BL 126 and the SL 128 in the desired directions through the cell 108.

Figure 3:
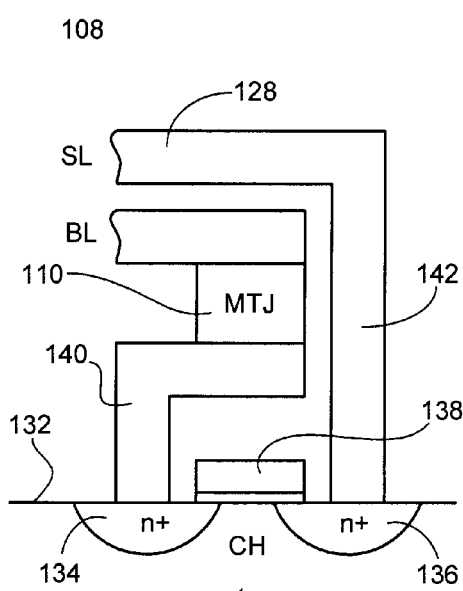
FIG. 3 displays an exemplary construction for the memory cell of FIG. 2.

FIG. 3 provides an elevational depiction of an exemplary construction for the memory cell 108 of FIG. 2. A base semiconductor layer 132 includes localized regions 134, 136 of n+ doped material. An isolated control gate 138 spans the regions 134, 136 to form the transistor 112. The WL 130 in FIG. 2 is coupled to the control gate 138, although the WL is not separately depicted in FIG. 3.

The MTJ 110 is supported by a support structure 140 to connect the MTJ 110 to the region 134. The BL 126 connects to an upper end of the MTJ 110. The SL 128 is connected to the region 136 via a second support structure 142. It will be appreciated that the structural configuration of FIG. 3 is merely exemplary in nature, and is not limiting in that any number of alternative configurations can be utilized.

While operable, memory cells such as shown at 108 can have write characteristics, in that a greater driver effort can be required to switch to some programmed states as compared to other programmed states. For example, FIG. 4 identifies a hard programming direction for the MTJ 110 by arrow 144, and an easy programming direction for the MTJ by arrow 146. The hard direction 144 corresponds to the direction of current flow (from SL 128 to BL 126) to switch of the MTJ 110 from the parallel to the anti-parallel state. The easy direction 146 to the direction of current flow (from BL 126 to SL 128) to switch the MTJ 110 from the anti-parallel state to the parallel state.

The relative ordering of the RSE and the switching device within a memory cell can also contribute to write characteristics. For example, it will be noted that in the hard programming direction 144, the write current traverses the drain-to-source channel of the MOSFET 112 prior to reaching the MTJ 110. The voltage presented to the MTJ 110 is thus substantially the voltage of the WL 130 (e.g., $V_{DD}$) minus the gate-to-source voltage $V_{GS}$ of the transistor. By contrast, in the easy programming direction 146 the write current passes through the MTJ 110 prior to the transistor 112, and the voltage presented to the MTJ 110 will be substantially the voltage of the BL 126 (e.g., $V_{DD}$).

Accordingly, various embodiments of the present invention are generally directed to compensating for write characteristics of a memory cell. As explained below, when programming in an easy programming direction, a nominal gate control voltage is provided to a switching device of the memory cell (e.g., $V_{DD}$). When programming in the hard direction, a boosting circuit is used to increase the applied gate control voltage to the cell switching device (e.g., $V_{DDV}>V_{DD}$). This boosted gate control voltage compensates for write asymmetries of the memory cell by facilitating a higher source voltage $V_S$ at an RSE of the memory cell.

In accordance with various embodiments, the boosting circuit utilizes a boosting capacitor to temporarily achieve the boosted voltage above the nominal voltage supplied by a voltage source. A delay element provides a delay of selected duration, after which the boosted voltage is returned to the nominal voltage. The boosted voltage is provided as a gate control input to the switching device to enhance current flow during the hard direction programming.

This can provide a number of benefits, such as increasing data throughput rates by reducing the time required to write data in the harder programming direction, reducing power consumption, and facilitating greater data densities in an array by allowing the use of smaller cell transistor geometries. Also, the boosted voltage can be obtained using only a single voltage source, further reducing power system complexities in the device.

Figure 4:
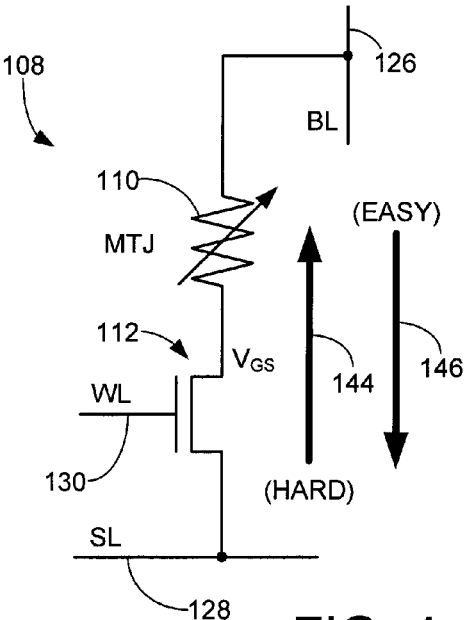
FIG. 4 is a schematic depiction of the memory cell of FIGS. 2-3.
Figure 5:
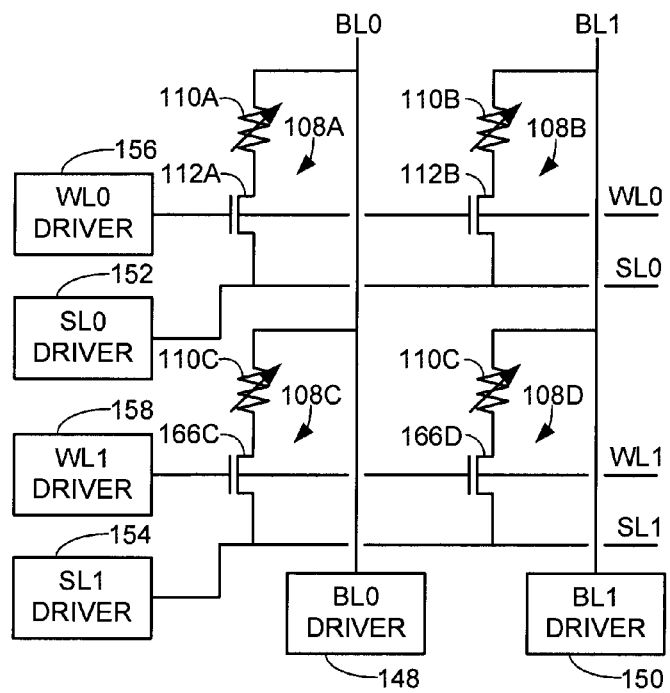
FIG. 5 is a schematic representation of portions of the array in FIG. 1 utilizing memory cells from FIGS. 2-4.

FIG. 5 shows a portion of the array 106 of FIG. 1 using a number of the exemplary STRAM memory cells of FIGS. 2-4, denoted as 108A-D. A plurality of control lines are provided to access the cells, including first and second bit lines BL0 and BL1 with associated drivers 148 and 150, first and second source lines SL0 and SL1 with associated drivers 152 and 154, and first and second word lines WL0 and WL1 with associated drivers 156 and 158.

It will be appreciated that the array in FIG. 5 can be extended to have any numbers of columns and rows of such cells, so the simplified 2×2 array configuration is merely for purposes of illustration and is not limiting. The various directions of the word, bit and source lines across the array are also merely exemplary and can be oriented as desired.

Write currents are applied to the respective cells 108A-D by asserting the associated word lines WL0, WL1 and initiating programming currents between the respective BL and SL drivers in the appropriate directions. To read the programmed state of a selected cell, a relatively small read current is passed through the selected cell to establish a voltage drop across the cell, such as on the associated BL. In some embodiments, this voltage is compared to a suitable reference voltage using a sense amplifier (not shown) to determine the programmed state of the cell.

Figure 6:
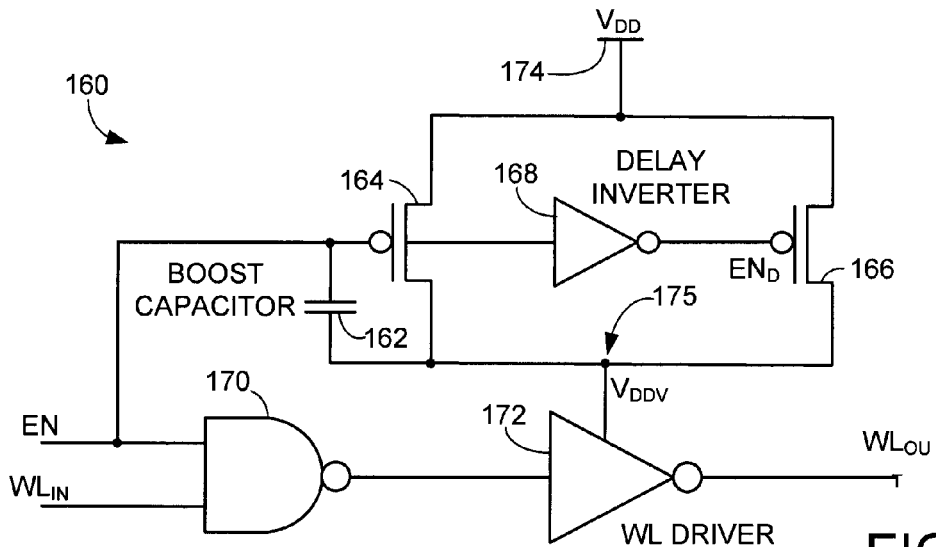
FIG. 6 is a schematic depiction of an exemplary voltage boosting circuit constructed and operated in accordance with various embodiments of the present invention.

In some embodiments, a boosting circuit 160 as shown in FIG. 6 is provided to increase the gate voltage applied to the respective word lines WL0, WL1 when writes are carried out in the hard direction. The boosting circuit 160 can be incorporated into each of the respective WL0, WL1 drivers 156 and 158, or can be a separate circuit that receives inputs from these drivers. These and other considerations will be discussed below.

The boosting circuit 160 includes a boost capacitor 162, first and second switching devices 164, 166, a delay inverter 168, a NAND gate 170 and an inverter (WL driver) 172. The switching devices 164, 166 are characterized as p-channel metal oxide semiconductor field effect transistors (PMOSFETs). The delay inverter 168 operates as a delay element. A source voltage $V_{DD}$ is supplied from a single source at terminal 174, and may be on the order of about +3.0V. A node 175 is denoted $V_{DDV}$ and is initially connected to the source voltage $V_{DD}$ via the first switching device 164. The node is subsequently disconnected and then reconnected to the source voltage in a manner discussed below.

An input signal $WL_{IN}$ represents an initial WL voltage supplied by the WL0, WL1 drivers 154, 156 (FIG. 5) and may be nominally equal to $V_{DD}$. An input signal EN constitutes an enable signal that is asserted high (e.g. $V_{DD}$) to place the boosting circuit 160 in an active state. In some embodiments, the enable signal EN is asserted during hard programming direction operations and is not asserted during easy programming direction operations. In such cases, during a write in the easy programming direction the boosting circuit 160 is bypassed and the nominal WL voltage $_{WLIN}$ is applied to the associated WL 130 (FIG. 5).

Figure 7:
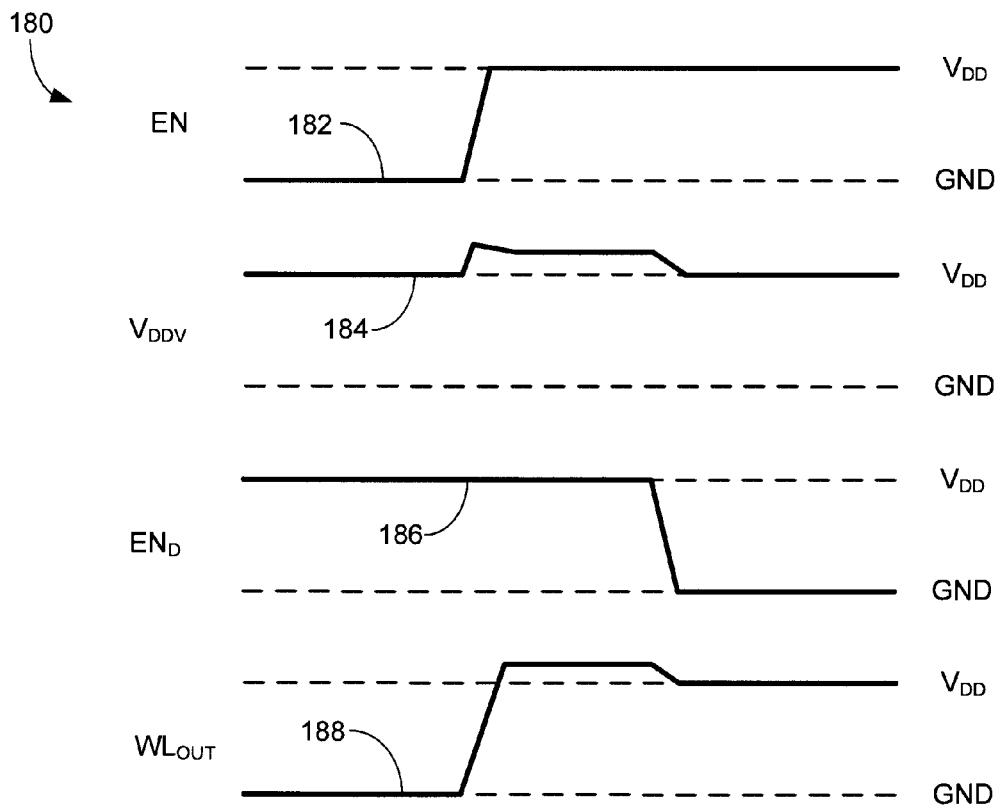
FIG. 7 is a general timing diagram associated with the operation of the voltage boosting circuit of FIG. 6.

FIG. 7 provides a timing diagram 180 to describe operation of the boosting circuit 160 of FIG. 6. Although not separately shown in FIG. 7, it will be appreciated that the $WL_{IN}$ signal of FIG. 6 is initially set high (e.g., $V_{DD}$) either prior to or coincident with assertion of an enable signal EN 182.

As the enable signal EN 182 transitions from a first level to a second level (e.g., high in FIG. 7), the drain-to-source path through the PMOSFET device 164 becomes nonconductive, so that the first switching device 164 disconnects the $V_{DD}$ terminal 174 from node 175. The boost capacitor 162 accumulates charge from the enable signal EN to generate a boosted (virtual) voltage $V_{DDV}$ 184 at node 175. The boosted voltage is greater than the nominal non-zero voltage $V_{DD}$ ($V_{DDV} > V_{DD}$) normally present at the node 175 when the EN signal is low, as shown in FIG. 7.

The enable signal EN 182 is further supplied as an input to the delay inverter 168, which operates to invert the enable signal to generate a delayed enable signal $EN_D$ 186 which transitions low as shown in FIG. 7. This places the drain-to-source path through the second PMOSFET switching device 166 in a conductive state, reconnecting the voltage source at terminal 174 to the node 175 and reducing the node voltage back to the nominal $V_{DD}$ level. It will be appreciated that the delay provided by the delay inverter 168 corresponds to the gate delay through the device. Other delay configurations can readily be used as desired.

Concurrent with the foregoing operation, the NAND gate 170 performs a NAND operation on the input $WL_{IN}$ and EN signals. When each of these signals is high, the NAND gate 170 outputs a low signal which is inverted to a high signal by the inverting WL driver 172 to provide an output signal $_{WLOUT}$ 188. It will be appreciated that other types of logical gating operations can readily be used besides that shown in FIG. 6.

The voltage at node 175 serves as an input rail voltage for the inverting WL driver 172. As the WL driver 172 transitions high, the $WL_{OUT}$ signal 188 will have a boosted component $V_{DDV}$ before falling to the nominal voltage $V_{DD}$ over the delay interval established by the delay inverter 168. This delay generally corresponds to the elapsed time interval between the respective level transitions of the EN and $EN_D$ signals 182, 186 in FIG. 7.

The $WL_{OUT}$ signal 188 is supplied to the control gate (e.g., 138 in FIG. 3) of the selected cell transistor 112. This provides an enhanced source voltage $V_S$ (see FIG. 4) during application of the hard direction write current, resulting in a higher effective voltage at the MTJ 110 during the write operation. The delay can be selected to correspond to the pulse interval necessary to achieve the hard direction switching. The boosting circuit employs only a single power source ($V_{DD}$ rail 174), which eliminates the need for multiple voltage sources as in various prior art solutions.

Figure 8:
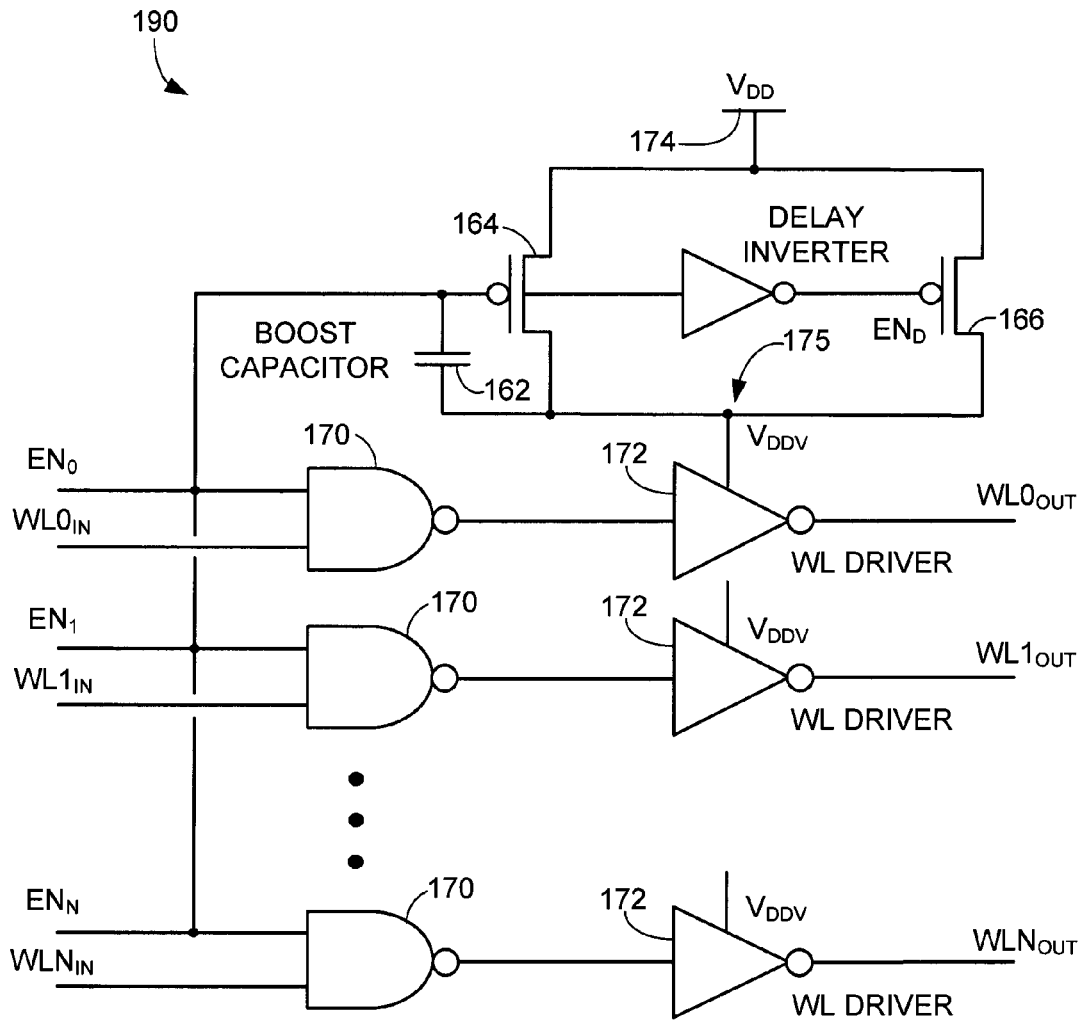
FIG. 8 shows an alternative configuration for a voltage boosting circuit in accordance with various embodiments.

FIG. 8 shows an alternative configuration for a boosting circuit 190 generally similar to the boosting circuit 160 in FIG. 6. The boosting circuit 190 operates to service a plurality of different word lines. The respective input WL signals $WL0_{IN}$ to $WLN_{IN}$ can be provided from different word line drivers such as the WL drivers 156, 158 in FIG. 5. In some embodiments, multiple word line drivers 172 can share a common boosting circuit 190.

Figure 9:
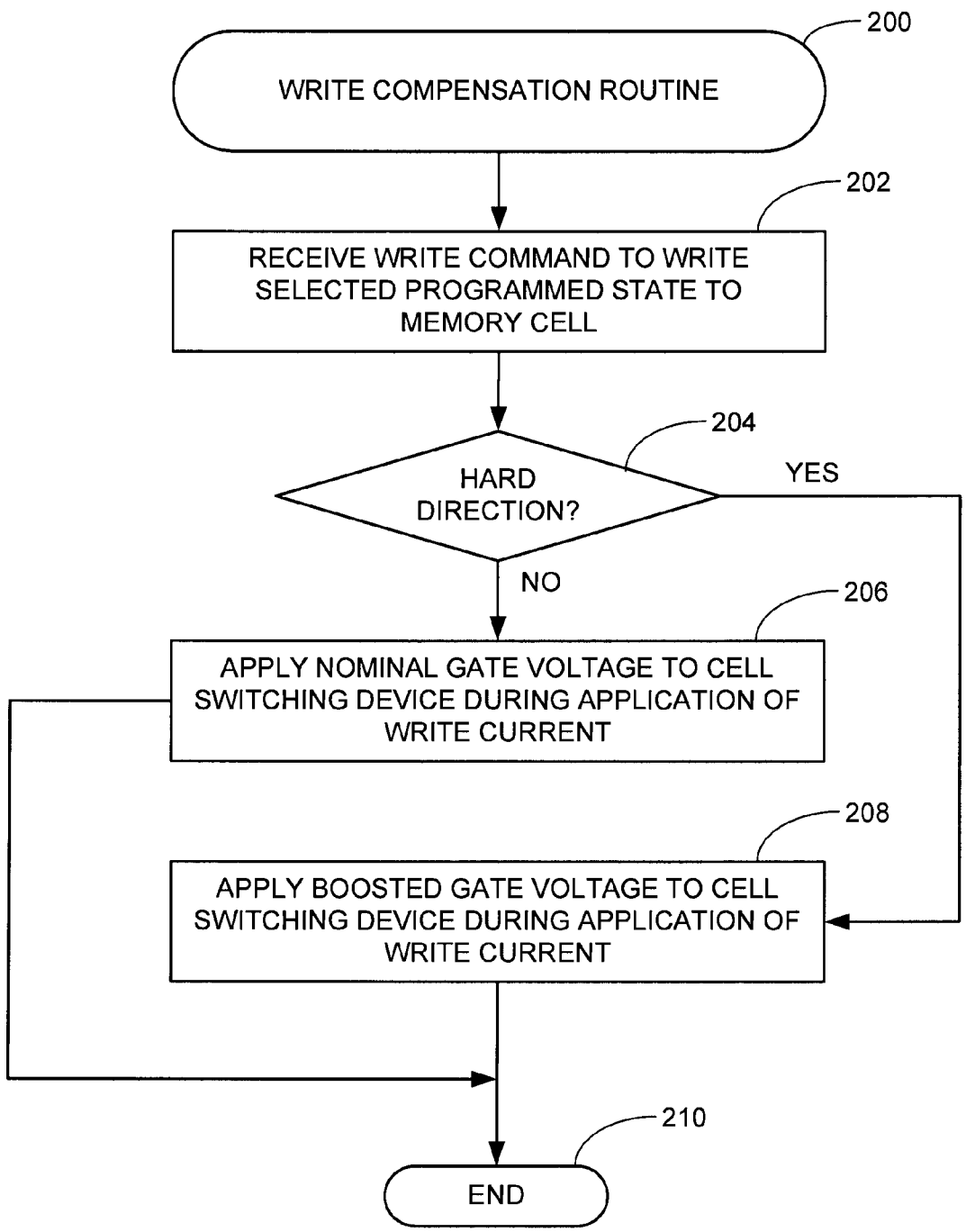
FIG. 9 is a flow chart for a WRITE COMPENSATION routine generally illustrative of steps carried out in accordance with various embodiments of the present invention.

FIG. 9 provides a flow chart for a WRITE COMPENSATION routine 200, generally illustrative of steps carried out in accordance with various embodiments of the present invention to compensate for write current characteristics in memory cells such as 108.

At step 202, a write command is received by a device such as 100 in FIG. 1 to write a selected programmed state to a selected memory cell. Decision step 204 determines whether the direction of the write current through the cell required to write the selected programmed state will be in the hard direction.

As discussed above, the hard direction as used herein describes a particular physical direction through the memory cell that provides greater resistance which corresponds to a smaller current flowing through the resistive sense element (RSE) for the a particular biased condition. Hence, writing a first selected state is more difficult as compared to that direction of the current required to set the RSE to a different, second selected state (the latter being referred to as the easy direction).

For example, the hard direction may correspond to the direction of current necessary to switch an MTJ such as 110 from a parallel to an anti-parallel state, as exemplified in FIG. 2. The hard direction may additionally or alternatively correspond to the direction through the memory cell such that the write current passes through the switching device such as 112 prior to passing through the RSE, as opposed to passing through the RSE prior to passing through the switching device (as in FIG. 4 at 144, 146).

If the programming direction is not in the hard direction, as shown in FIG. 8 the flow passes to step 206 where a nominal word line (control line) gate voltage is applied to the cell switching device to facilitate application of the easy direction write current. If the programming direction is in the hard direction, the flow alternatively passes to step 208 where a boosted word line (control line) gate voltage is applied to the cell switching device to facilitate application of the hard direction write current. The routine then ends at step 210.

The boosting circuits 160, 190 can further be advantageously utilized during the writing of respective programmed states to a plurality of memory cells. Input data constituting a multibit word of selected length (8 bits, 64 bits, 1024 bits, etc.) made up of a sequence of logical states (e.g., 0s, 1s. 01s, etc.) can be respectively written to individual cells to store the input sequence. In some embodiments, the cells to which the input data are each connected to a different word line WL, such as cells 108A and 108C shown in FIG. 5. In such case, boosted WL voltages are applied to the word lines for those cells requiring programming in the hard direction, and nominal WL voltages are applied to the remaining cells.

In other embodiments, the cells to which the input data are written all share a common word line WL, such as cells 108A and 108B in FIG. 5. The cells can be sequentially written to the respective states one at a time, with the WL voltage elevated to a boosted level for cells with hard direction writes and maintained at a nominal level for cells with easy direction writes.

That is, each time a cell is encountered in the sequence that requires a hard direction write, the EN signal is asserted high, resulting in a temporary boost in the $WL_{OUT}$ voltage. Since the $WL_{OUT}$ quickly returns to the $V_{DD}$ level after being boosted to the $V_{DDV}$ level, the $WL_{OUT}$ signal can be continuously applied to the WL, and the easy direction writes can be carried out while the $WL_{OUT}$ signal is at the nominal $V_{DD}$ level. In this way, the $WL_{OUT}$ signal 188 in FIG. 7 would be provided with a succession of boosted levels and nominal levels corresponding to the data pattern being written to the successive cells.

Alternatively, the circuitry in FIG. 6 can be readily modified to carry out simultaneous write operations to the respective programming states. For example, all of the cells connected to the same WL requiring programming in the hard direction could be simultaneously written while the $WL_{OUT}$ signal is at the boosted level. All of the cells connected to the WL requiring programming in the easy direction could be subsequently, simultaneously written after the $WL_{OUT}$ signal falls back to the nominal $V_{DD}$ level.

It will be appreciated that while various embodiments discussed herein have been directed to an RSE characterized as an STRAM MTJ, it will be appreciated that such is not necessarily required. Rather, other memory cell constructions with other types of RSEs can be readily used in accordance with the foregoing embodiments.

Figure 10A:
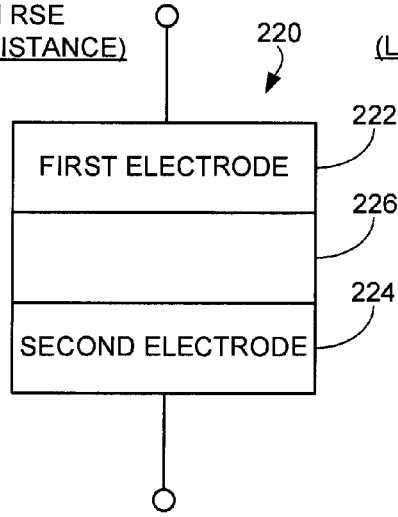
FIGS. 10A-10B shows an alternative memory cell construction utilizing resistive random access memory (RRAM).
Figure 10B:
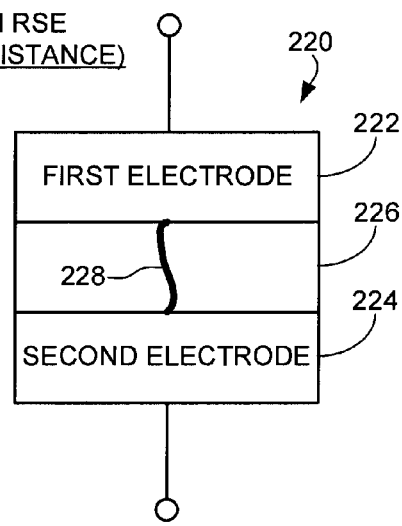

FIGS. 10A-10B show an exemplary RSE construction 220 characterized as resistive random access memory (RRAM). Opposing metal or metal alloy electrode layers 222, 224 are separated by an intervening oxide layer 226. A first, higher resistance programmed state is denoted by FIG. 10A, and a second, lower resistance programmed state is denoted by FIG. 10B.

In FIG. 10A, the relatively higher resistance state is established by the nominal electrical resistance of the oxide layer 226. Application of a suitable write voltage potential and/or write current in a selected direction across the RSE 220 will induce metal migration from the electrode layer 222, forming one or more electrically conductive metallization filaments 228 through the oxide layer as shown in FIG. 10B.

Such filaments generally operate to lower the characteristic resistance of the cell. To return the programmed state of the RSE 220 to the high resistance state of FIG. 10A, an appropriate write voltage potential and/or current is applied through the RSE 220 in the opposite direction.

RRAM RSEs such as 220 can exhibit asymmetric write characteristics in that it can be generally more difficult to program the RSE 220 in a first direction as compared to a second direction. For example, the hard direction for programming the RSE 220 may be to the high resistance state of FIG. 10A, and the easy direction for programming the RSE 220 may be to the low resistance state of FIG. 10B.

Figure 11:
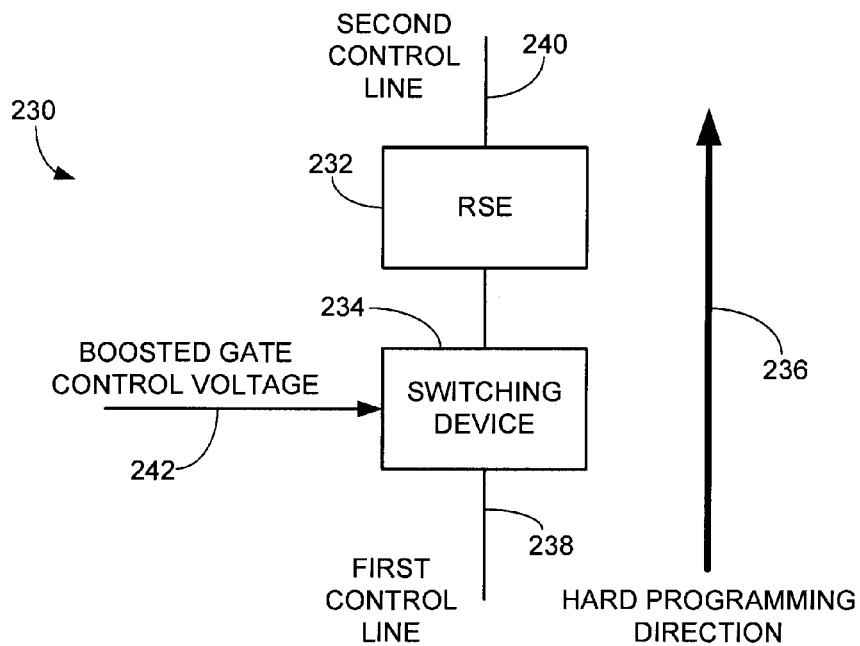
FIG. 11 is a functional block diagram illustrating operation of various embodiments.

FIG. 11 shows a functional block representation of a generalized memory cell 230 with an RSE 232 coupled to a switching device 234. The RSE can take any number of configurations including the exemplary STRAM MTJ 110 or the RRAM RSE 220. A hard direction for programming the RSE 232 is indicated by arrow 236, indicative of the direction of write current through the RSE 232 to program the RSE in the hard direction. The write current is supplied to the cell 230 from a first control line 238, which may be characterized as a source line (SL), and passes through the cell 230 to a second control line 240, which may be characterized as a bit line (BL).

During such programming in the hard direction 236, a boosted gate control voltage is applied to the switching device 234, as shown at 242. It will be appreciated that when programming the cell 230 in the opposing easy direction (opposite that of direction 236), a nominal (non-boosted) gate control voltage is supplied to the switching device 234.

Although various embodiments set forth above generally identify the hard and easy directions based on the relative sequential ordering of a resistive sense element and a switching device of a cell, such is not necessarily limiting. Rather, it is contemplated that various memory cell constructions may alternatively have an "easy" and a "hard" direction based on some other feature of the cell. It will be understood that the various embodiments disclosed herein are equally suitable for these other types of memory cells in obtaining read current symmetry without compromising cell reliability. Moreover, it will be appreciated that in situations where multiple states are written, there can still be a hard programming direction to write some states, and an easy programming direction to write other states.

As can be appreciated by one skilled in the art, the various embodiments illustrated herein provide advantageous writing of data to a memory cell in a fast and reliable manner. The ability to compensate for write current required to write various resistance states allows for consistent data writing without elevated power consumption. The use of a compensated write current with a single boosting voltage supply vastly improves the efficiency and complexity of any electronic data storage device. Moreover, the dynamic nature of the write current compensation provides increased performance with respect to write current driving ability. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a voltage boosting circuit adapted to apply a temporarily boosted voltage to a gate structure of a non-volatile memory cell during a data write operation, the memory cell comprising a programmable resistive sense element (RSE) in series with a switching device, the gate structure forming a portion of said switching device, the voltage boosting circuit comprising a capacitor which adds charge to a nominal non-zero voltage applied to the gate structure responsive to a write enable signal that facilitates the writing of data in a hard direction through the cell.

2. The apparatus of claim 1, in which the hard programming direction comprises a direction of write current through the memory cell such that said current passes through the switching device prior to passing through the RSE.

3. The apparatus of claim 1, in which the switching device is characterized as a metal oxide semiconductor field effect transistor having respective gate, drain and source terminals, the temporarily boosted voltage applied to said gate terminal, the write current successively flowing through said drain and source terminals and then through said RSE.

4. The apparatus of claim 1, in which the voltage boosting circuit further comprises a delay element which generates a delay of predetermined elapsed time responsive to the enable signal, wherein at the conclusion of said delay the voltage applied to the gate structure drops to said non-zero voltage.

5. The apparatus of claim 1, in which the voltage boosting circuit further comprises a switching device connected in parallel with the capacitor and having respective gate, source and drain terminals, the gate terminal of the switching device connected to an input conductor along which the enable signal is passed, wherein application of the enable signal to said gate terminal decouples a baseline voltage from an output driver and facilitates a transfer of charge from the capacitor to said output driver to generate said temporarily boosted voltage.

6. The apparatus of claim 1, further comprising a data storage array coupled to the voltage boosting circuit of which the non-volatile memory cell forms a part, the array comprising:
   a plurality of nominally identical memory cells arranged into rows and columns, each memory cell comprising a switching device in series with a programmable resistive sense element (RSE);
   a plurality of spaced apart bit lines each extending along a selected column of memory cells to interconnect the memory cells along each said column; and
   a plurality of spaced apart word lines each extending along a selected row of memory cells to interconnect the switching devices of the memory cells along each said row, wherein the voltage boosting circuit is adapted to selectively apply said boosted voltage to each of the respective word lines in turn during write operations to memory cells associated therewith.

7. The apparatus of claim 6, further comprising a write circuit coupled to said bit lines and adapted to apply write currents thereto concurrently with the application of the boosted voltage from the voltage boosting circuit during said write operations.

8. The apparatus of claim 1, in which the RSE comprises a magnetic tunneling junction (MTJ) with a reference layer having a magnetic orientation in a fixed direction and a free layer having a magnetic orientation in selectively different directions, and the hard programming direction comprises a direction of write current through the memory cell such that said current passes through the switching device prior to passing through the MTJ.

9. The apparatus of claim 1, in which the RSE comprises a resistive random access memory (RRAM) element adapted to exhibit different programmed electrical resistances responsive to application of write currents through the memory cell, the hard programming direction comprising a direction of write current through the memory cell such that said current passes through the switching device prior to passing through the RRAM element.

10. A voltage boosting circuit, comprising:
   a conductor adapted to receive a write enable signal that undergoes a voltage level transition to facilitate a write operation upon a non-volatile memory cell;
   a capacitor coupled to the conductor to store charge responsive to the voltage level of said conductor;
   a switching device having respective drain, source and gate terminals, the gate terminal connected to the conductor in parallel with the capacitor; and
   an output driver having an input coupled to the conductor and a rail voltage input node connected to the capacitor and the switching device, wherein responsive to the write enable signal the capacitor is charged, the switching device decouples a non-zero source voltage from the rail voltage node, the capacitor supplies a temporarily boosted voltage greater than said non-zero source voltage to said rail voltage input node, and the output driver applies a corresponding voltage to a gate structure of the memory cell during a write operation to write data in a hard direction through the cell.

11. The voltage boosting circuit of claim 10, further comprising:
   a delay element having an input connected to the conductor in parallel with the switching device and the capacitor; and
   a second switching device having respective drain, source and gate terminals, the gate terminal of the second switching device connected to an output of the delay element, wherein responsive to the write enable signal the delay element generates a delay after which the delay element provides a voltage to the second switching device to reconnect the non-zero source voltage to the rail voltage input node of the output driver, thereby reducing a magnitude of the voltage output by the output driver and applied to the gate structure to a non-zero level.

12. The voltage boosting circuit of claim 11, in which the switching device and the second switching device are each characterized as a p-channel metal oxide semiconductor field effect transistor (pMOSFET).

13. A method for writing data comprising:
   transmitting a write enable signal along a conductor to facilitate the writing of data in a hard direction through a non-volatile memory cell; and
   using the write enable signal to concurrently charge a capacitor and to decouple a nominal non-zero voltage from a rail voltage input of an output driver, said charged capacitor applying a boosted voltage greater than said non-zero voltage to the rail voltage input.

14. The method of claim 13, in which the memory cell comprises a programmable resistive sense element (RSE) in series with a switching device, the gate structure forming a portion of said switching device, the temporarily boosted voltage applied during application of a write current in said hard direction through the cell to switch the RSE to a selected data state.

15. The method of claim 13, in which the using step further comprises generating a delay of predetermined elapsed time responsive to the write enable signal, and reducing the voltage at said gate structure to the non-zero voltage at the conclusion of said delay.

16. The method of claim 13, in which the using step comprises employing a switching device connected in parallel with the capacitor and having respective gate, source and drain terminals, the gate terminal of the switching device connected to an input conductor along which the enable signal is passed, wherein application of the enable signal to said gate terminal decouples a baseline voltage from an output driver and facilitates a transfer of charge from the capacitor to said output driver to generate said temporarily boosted voltage.

17. The method of claim 13, further comprising passing a write current through the memory cell in said hard direction concurrently with the application of the boosted voltage greater than said non-zero voltage to the rail voltage input.

18. The method of claim 17, in which the memory cell comprises a switching device in series with a magnetic tunneling junction (MTJ), the write current programming the MTJ to a selected data state and passing through the switching device prior to passing through the MTJ.

19. The method of claim 13, in which the memory cell is characterized as a selected memory cell in an array of nominally identical memory cells arranged into rows and columns with the memory cells along each row interconnected to a separate word line, and the using step further comprises using the output driver to apply a boosted voltage to a selected word line coupled to the selected memory cell.

20. The method of claim 13, in which the memory cell comprises a switching device in series with a resistive random access memory (RRAM) element adapted to exhibit different programmed electrical resistances responsive to application of write currents through the memory cell, the hard programming direction comprising a direction of write current through the memory cell such that said current passes through the switching device prior to passing through the RRAM element.

* * * * *